(12) United States Patent
Hegde et al.

(10) Patent No.: US 9,865,436 B1
(45) Date of Patent: Jan. 9, 2018

(54) POWERED ANODE FOR ION SOURCE FOR DLC AND REACTIVE PROCESSES

(71) Applicant: Plasma-Therm LLC, St. Petersburg, FL (US)

(72) Inventors: Sarpangala H. Hegde, Fremont, CA (US); VIncent Lee, Fremont, CA (US)

(73) Assignee: PLASMA-THERM NES LLC, St. Petersburg, FL (US)

( * ) Notice: Subject to any disclaimer, the term of this patent is extended or adjusted under 35 U.S.C. 154(b) by 0 days.

(21) Appl. No.: 15/206,300

(22) Filed: Jul. 10, 2016

Related U.S. Application Data

(60) Provisional application No. 62/348,751, filed on Jun. 10, 2016.

(51) Int. Cl.
| | |
|---|---|
| *H01J 27/00* | (2006.01) |
| *H01J 37/32* | (2006.01) |
| *C23C 16/505* | (2006.01) |
| *C23C 16/27* | (2006.01) |
| *H01L 21/67* | (2006.01) |

(52) U.S. Cl.
CPC ...... *H01J 37/32633* (2013.01); *C23C 16/272* (2013.01); *C23C 16/505* (2013.01); *H01J 37/32082* (2013.01); *H01J 37/32422* (2013.01); *H01J 37/32458* (2013.01); *H01L 21/67069* (2013.01); *H01J 2237/334* (2013.01); *H01J 2237/3321* (2013.01)

(58) Field of Classification Search
None
See application file for complete search history.

(56) References Cited

U.S. PATENT DOCUMENTS

| | | | | |
|---|---|---|---|---|
| 5,969,470 A | * | 10/1999 | Druz | H01J 27/16 313/231.01 |
| 6,464,891 B1 | * | 10/2002 | Druz | C23C 14/0605 134/1 |
| 2009/0250340 A1 | * | 10/2009 | Sasaki | H01J 37/3053 204/298.02 |
| 2012/0247678 A1 | * | 10/2012 | Takahashi | H01J 37/32009 156/345.44 |

OTHER PUBLICATIONS

Y. Lifshitz, Diamond-like Carbon—present status, Diamond and Related Materials, 1999, pp. 1659-1676, vol. 8.
J. Robertson, Diamond-like Amorphous Carbon, Material Science and Engineering, 2002, pp. 129-281, R 37.
Q. Wei, J. Narayanan, Superhard Diamondlike Carbon: Preparation, Theory, and Properties, International Materials Review, 2000, pp. 133-164, vol. 45 No. 4.

(Continued)

*Primary Examiner* — Andrew Smyth
(74) *Attorney, Agent, or Firm* — Burr & Forman LLP; Harvey S. Kauget

(57) ABSTRACT

The present invention provides a charged particle source comprising a plasma processing chamber that has a plasma source, a gas supply and an ion extraction grid that are each operatively connected to the processing chamber. A conducting plate is located adjacent to a wall of the plasma source. The conducting plate has a surface with a plurality of grooves that face the wall of the plasma source. A substrate support is disposed within an interior portion of the processing chamber for supporting a substrate.

21 Claims, 5 Drawing Sheets

(56) References Cited

OTHER PUBLICATIONS

J.C. Damasceno, et.al, DLC-Si Protective Coatings for Polycarbonates, Materials Research, 2002, pp. 19-23, vol. 6, No. 1.
R.Gago, et.al., Bonding and Hardness in Nonhydrogenated Carbon Films with Moderate sp3 Content, Journal of Applied Physics, Jun. 2000, pp. 8174-8180, vol. 87 No. 11.
J. Schwan, et. al., Tetrahedral Amorphous Carbon Films Prepared by Magnetron Sputtering and DC Ion Plating, Journal of Applied Physics, Feb. 1, 1996, pp. 1416-1422, vol. 79 No. 3.

* cited by examiner

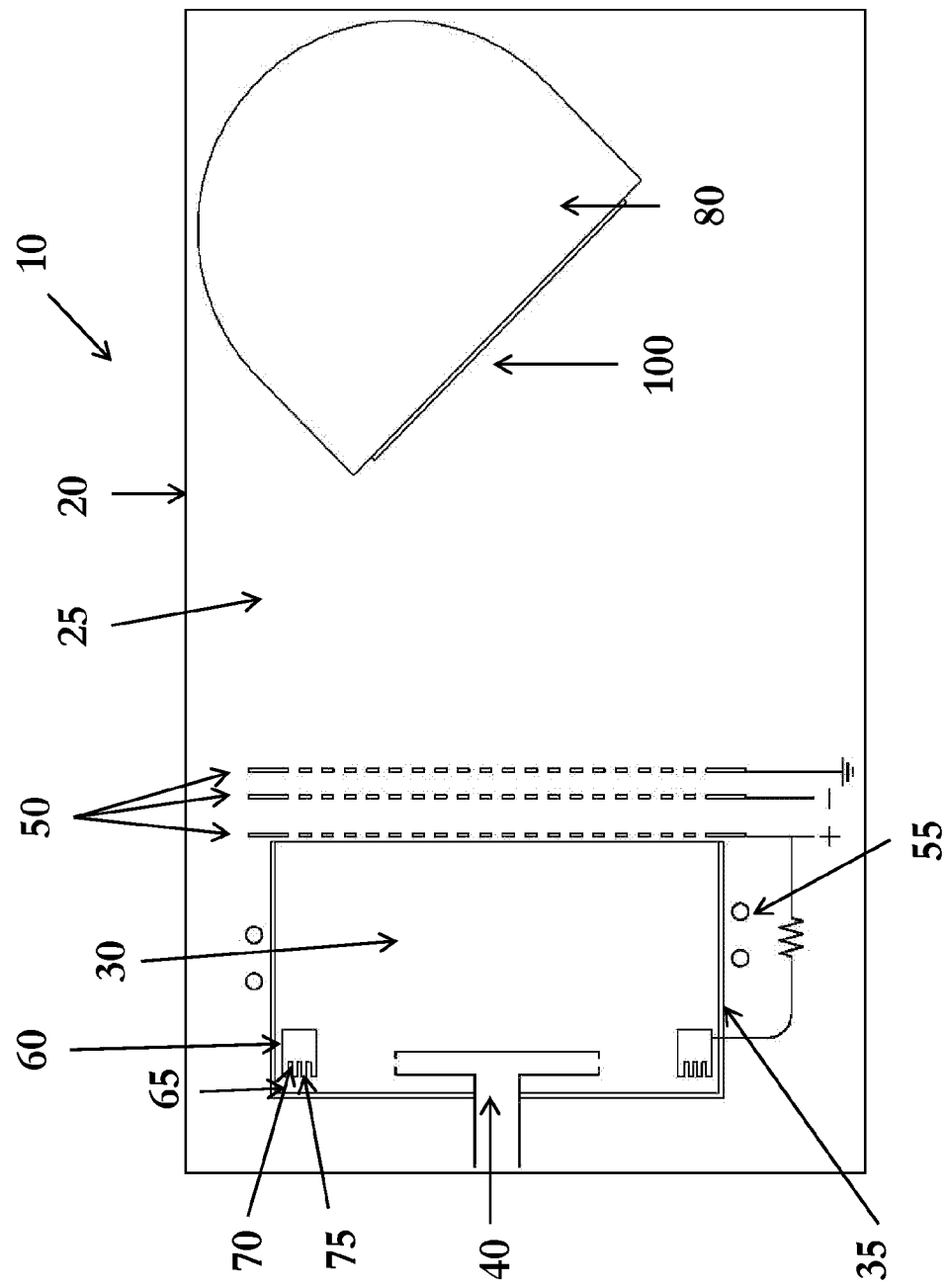

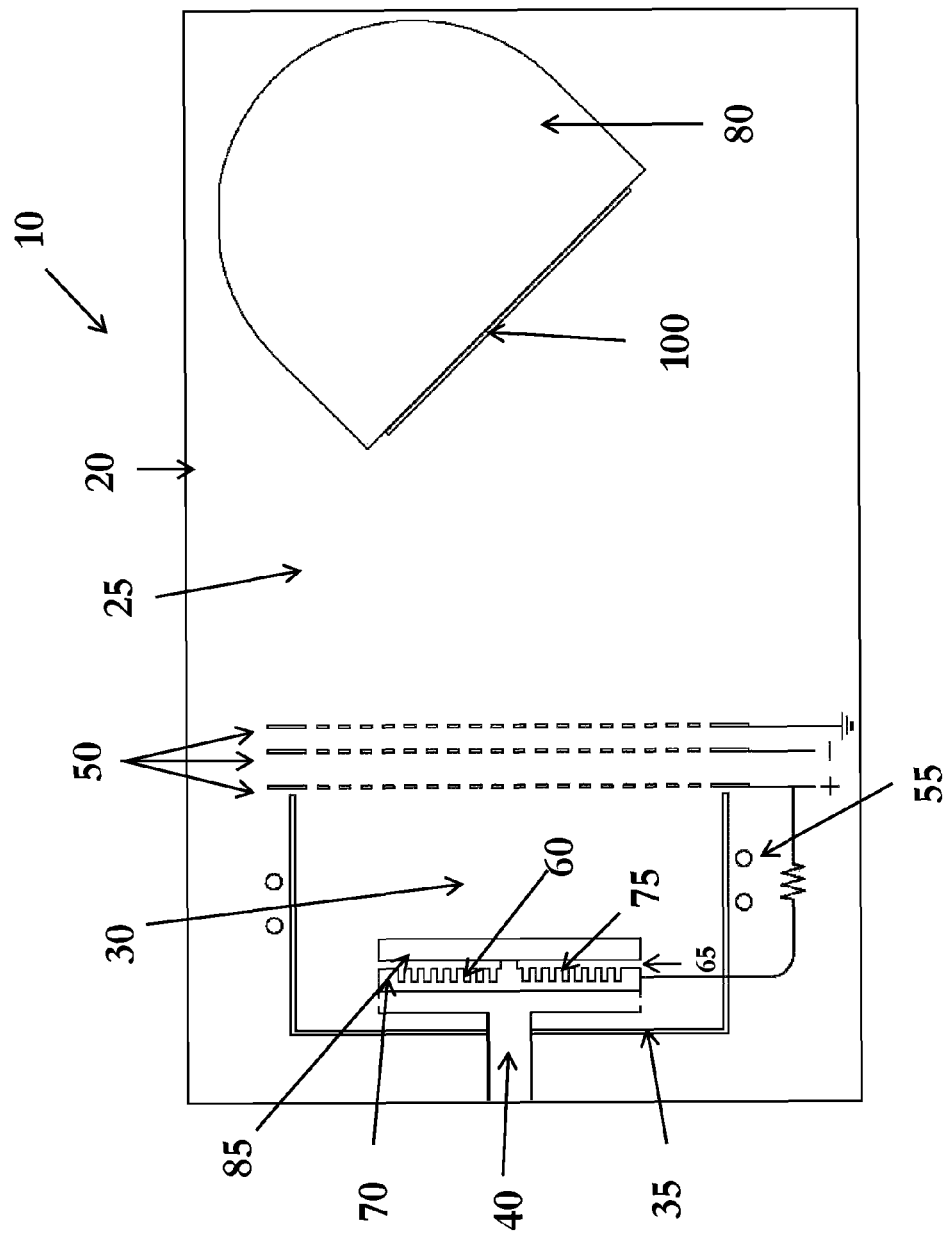

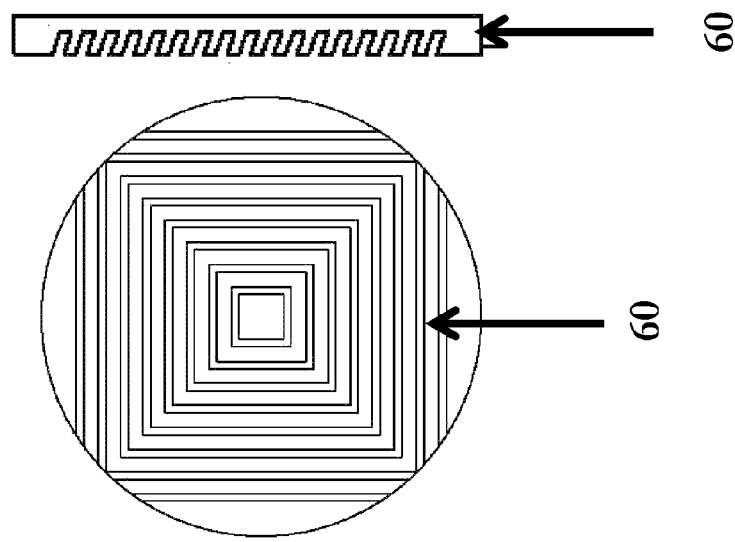
Fig. 5D
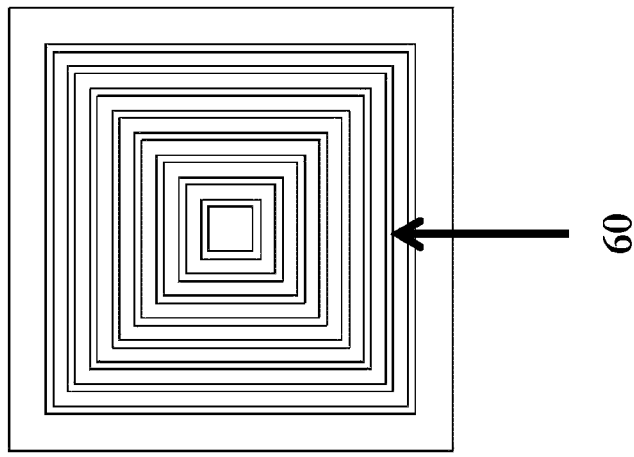
Fig. 5C
Fig. 5B
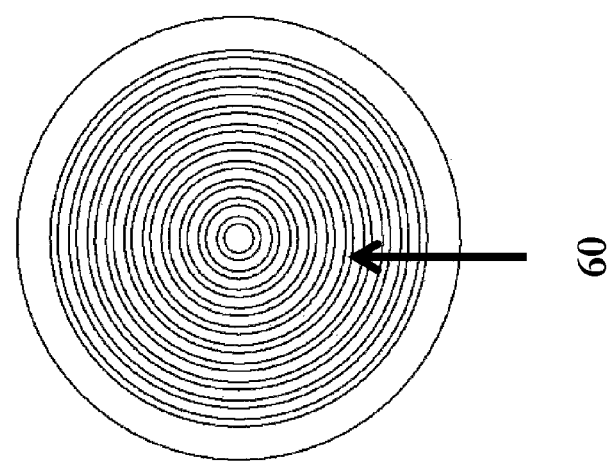
Fig. 5A ized, and stop providing an escape path for the electrons. In a Hydrocarbon (CH) precursor based plasma needed for the Tetrahedral Hydrogenated Carbon (Ta—C—H) direct ion beam for diamond-like carbon (DLC) films, as soon as the plasma is created, very low energy CHx+ ions deposit on all exposed surfaces, including the beam grid surface. This creates a thin Carbon coating on all such exposed surfaces in the ion source, and eliminates the escape path for the electrons in the plasma as the ions are extracted from the plasma. Plasma instability is caused as a result, and severe arcing is created, causing source instability, as well as particles within the system.

POWERED ANODE FOR ION SOURCE FOR DLC AND REACTIVE PROCESSES

CROSS REFERENCES TO RELATED APPLICATIONS

This utility patent application claims priority from and is related to commonly owned U.S. Provisional Application No. 62/348,751 filed Jun. 10, 2016, entitled: Powered Anode for Ion Source for DLC and Reactive Processes, this Provisional Patent Application incorporated by reference herein.

FIELD OF THE INVENTION

Invention relates to the field of charged particle sources including broad-beam ion sources for ion beam deposition and etching, and electron sources for surface modification.

BACKGROUND OF THE INVENTION

Charged particle sources are used for various surface modification, etching and deposition applications, and are particularly advantageous compared to other methods for providing direct control of particle energy and flux, angle of incidence to the substrate, and isolation of the substrate from the conditions of the reactor used to generate the etching and or depositing species.

In an ion beam source, ions are extracted from the plasma in the source. Since a plasma is quasi-neutral, equal number of electrons need to escape from the plasma, before plasma instabilities are caused. The escape path for the electrons is the beam grid, which is a conducting path for the electrons.

In a non-reactive gas plasma, such as an Argon (Ar+) plasma, the beam grid surface remains conductive, and provides a very reliable escape path for the electrons. However, when reactive gases are used, the beam grid surface can get oxidized, and stop providing an escape path for the electrons. In a Hydrocarbon (CH) precursor based plasma needed for the Tetrahedral Hydrogenated Carbon (Ta—C—H) direct ion beam for diamond-like carbon (DLC) films, as soon as the plasma is created, very low energy CHx+ ions deposit on all exposed surfaces, including the beam grid surface. This creates a thin Carbon coating on all such exposed surfaces in the ion source, and eliminates the escape path for the electrons in the plasma as the ions are extracted from the plasma. Plasma instability is caused as a result, and severe arcing is created, causing source instability, as well as particles within the system.

Therefore, what is needed is a charged particle source that reduces the Carbon coating on the exposed surfaces of the beam grid in the ion source.

Nothing in the prior art provides the benefits attendant with the present invention.

Therefore, it is an object of the present invention to provide an improvement which overcomes the inadequacies of the prior art devices and which is a significant contribution to the advancement of depositing Carbon using a charged particle source.

Another object of the present invention is to provide a charged particle source comprising: a plasma processing chamber; a plasma source having a wall operatively connected to the processing chamber; an ion extraction grid operatively connected to the processing chamber; a conducting plate within the plasma source and adjacent to the wall of the plasma source, the conducting plate having a surface having a plurality of grooves, the plurality of grooves facing the wall of the plasma source; a substrate on a substrate support disposed in an interior portion of the processing chamber; and a gas supply operatively connected to the processing chamber.

Yet another object of the present invention is to provide a charged particle source comprising: a plasma processing chamber; a plasma source having a wall operatively connected to the processing chamber; a plurality of ion extraction grids operatively connected to the processing chamber; a conducting plate within the plasma source at a distance from the wall of the plasma source, the conducting plate having a plurality of grooves, the plurality of grooves facing the wall of the plasma source; a substrate on a substrate support disposed in an interior portion of the processing chamber; and a gas supply operatively connected to the processing chamber.

Still yet another object of the present invention is to provide a charged particle source comprising: a plasma processing chamber; a plasma source having a wall operatively connected to the processing chamber; a plurality of ion extraction grids operatively connected to the processing chamber; a conducting plate within the plasma source at an adjustable distance from the wall of the plasma source, the conducting plate having a plurality of grooves, the plurality of grooves facing the wall of the plasma source, the conducting plate being opposite the plurality of ion extraction grids; a substrate on a substrate support disposed in an interior portion of the processing chamber; and a gas supply operatively connected to the processing chamber.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The present invention describes a charged particle source for arc prevention and stable operation of ion source in processing of diamond-like carbon (DLC) films.

Another feature of the present invention is to provide a charged particle source comprising a plasma processing chamber that has a plasma source, a gas supply and an ion extraction grid that are each operatively connected to the processing chamber. A conducting plate is located adjacent to a wall of the plasma source. The conducting plate can be attached to the wall of the plasma source. The conducting plate has a surface with a plurality of grooves that face the wall of the plasma source. The plurality of grooves can have an aspect ratio of greater than two to one. The plurality of grooves can have a constant aspect ratio. The plurality of grooves can have a variable aspect ratio. The plurality of grooves can have a constant pitch. The plurality of grooves can have a variable pitch. The plurality of grooves can be in a perpendicular orientation with respect to the surface of the conducting plate. The conducting plate can further comprise a second surface that has a second plurality of grooves. A substrate support is disposed within an interior portion of the processing chamber for supporting a substrate.

Yet another feature of the present invention is to provide a charged particle source comprising a plasma processing chamber that has a plasma source, a gas supply and a plurality of ion extraction grids that are each operatively connected to the processing chamber. A conducting plate is located at a distance from a wall of the plasma source. The distance can be between 0.5 mm and 20 mm. The conducting plate can be attached to the wall of the plasma source. The conducting plate has a surface with a plurality of grooves that face the wall of the plasma source. The plurality of grooves can have an aspect ratio of greater than two to one. The plurality of grooves can have a constant aspect ratio. The plurality of grooves can have a variable aspect ratio. The plurality of grooves can have a constant pitch. The plurality of grooves can have a variable pitch. The plurality of grooves can be in a slanted orientation with respect to the surface of the conducting plate. The conducting plate can further comprise a second surface that has a second plurality of grooves where the second plurality of grooves can have a separation between 0.5 mm and 20 mm. A substrate support is disposed within an interior portion of the processing chamber for supporting a substrate.

Still yet another feature of the present invention is to provide a charged particle source comprising a plasma processing chamber that has a plasma source, a gas supply and a plurality of ion extraction grids that are each operatively connected to the processing chamber. A conducting plate is located opposite the plurality of ion extraction grids at an adjustable distance from a wall of the plasma source. The adjustable distance can be between 0.5 mm and 20 mm. The conducting plate can be attached to the wall of the plasma source. The conducting plate has a surface with a plurality of grooves that face the wall of the plasma source. The plurality of grooves can have an aspect ratio of greater than two to one. The plurality of grooves can have a constant aspect ratio. The plurality of grooves can have a variable aspect ratio. The plurality of grooves can have a constant pitch. The plurality of grooves can have a variable pitch. The plurality of grooves can be in a slanted orientation with respect to the surface of the conducting plate. The conducting plate can further comprise a second surface that has a second plurality of grooves where the second plurality of grooves can have a separation between 0.5 mm and 20 mm. A substrate support is disposed within an interior portion of the processing chamber for supporting a substrate.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

FIG. 3 is a schematic view of a charged particle source according to one embodiment of the present invention;

FIG. 4 is a schematic view of a charged particle source according to one embodiment of the present invention; and FIGS. 5A to 5D show a series of blown up views of different configurations of the conducting plate that can be used in any embodiment of the present invention.

Similar reference characters refer to similar parts throughout the several views of the drawings.

DETAILED DESCRIPTION OF THE INVENTION

Figure 1:
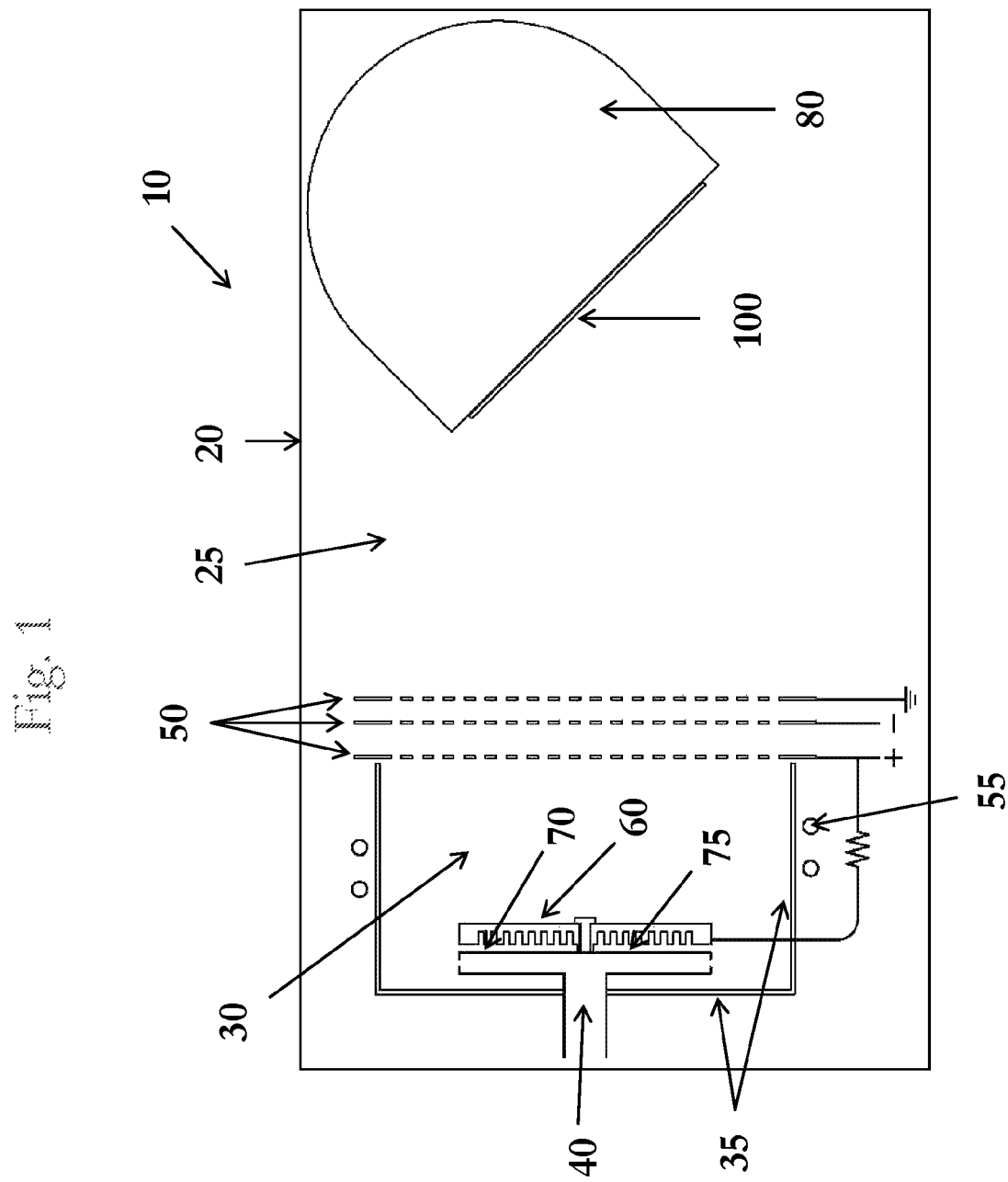
FIG. 1 is a schematic view of a charged particle source according to one embodiment of the present invention.

As shown in FIG. 1, a charged particle source 10 comprising a plasma processing chamber 20 that has a plasma source 30, a gas supply 40, RF antenna 55, and ion extraction grid(s) 50 that are each operatively connected to the processing chamber 20 according to one embodiment of the present invention. The ion extraction grid(s) 50 can be comprised of one or more grids 50. These grids 50 can be connected to one or more power supplies (not shown). The power supply can generate RF, DC or pulsed (RF or DC) power. One or more of the ion extraction grids 50 can be held at a grounded potential. A conducting plate 60 is shown adjacent to a wall 35 of the plasma source 30. The conducting plate 60 can be connected to a power supply (not shown). The power supply can supply RF, DC, or pulsed (RF or DC) power. The pulses can be between a power level (on) and zero (off), or between two or more power levels (e.g. high and low power). The pulse frequency and amplitude can be held constant and or varied during the process. The power supply connected to the conducting plate 60 can be the same power supply connected to one or more of the ion extraction grid(s) 50. Whereas, the conducting plate 60 can also be attached to the wall 35 of the plasma source 30. The conducting plate 60 has a surface 70 with a plurality of grooves 75 that face the wall 35 of the plasma source 30. A substrate support 80 is disposed within an interior portion 25 of the processing chamber 20 for supporting a substrate 100.

Figure 2:
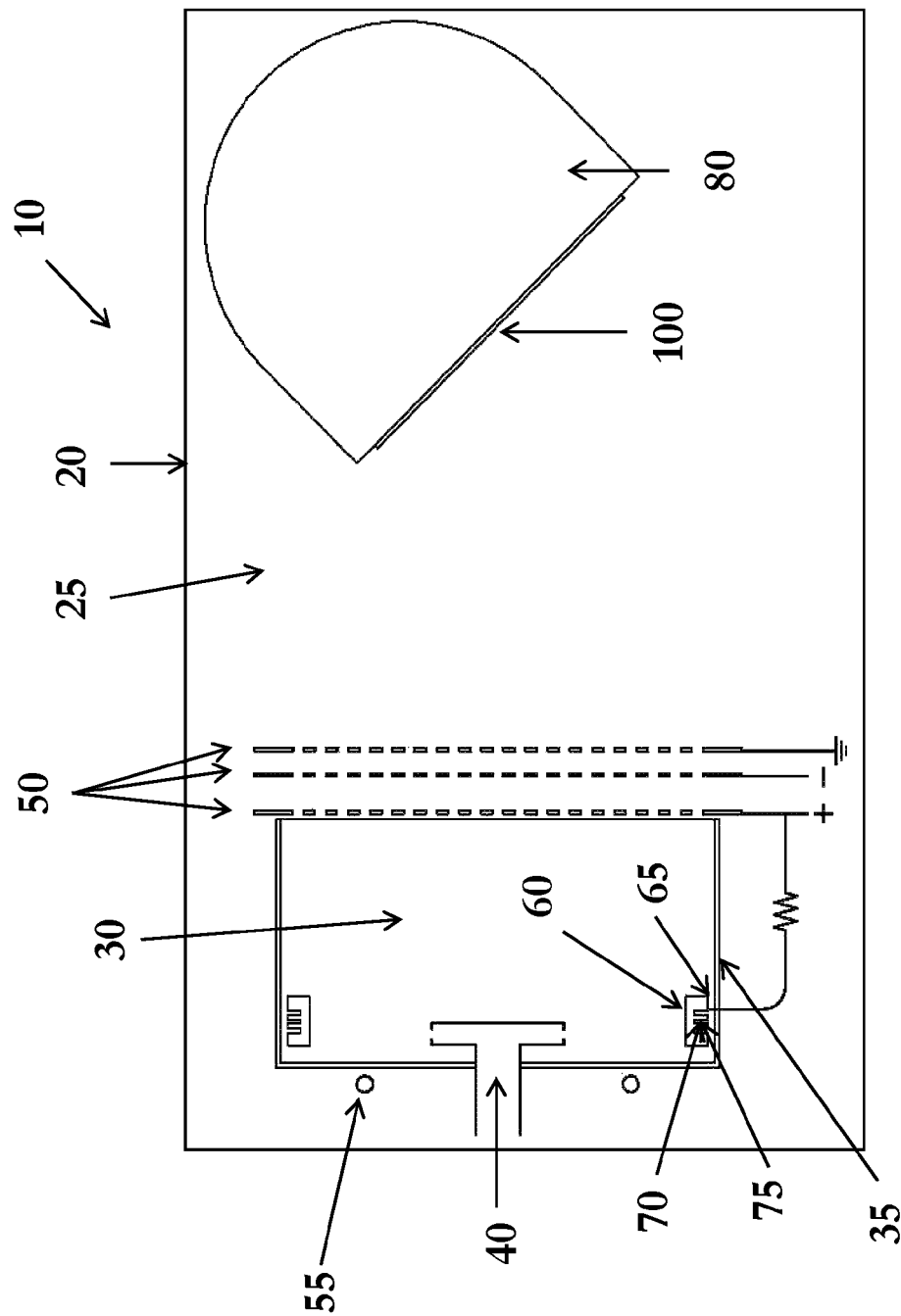
FIG. 2 is a schematic view of a charged particle source according to one embodiment of the present invention.

As shown in FIG. 2, a charged particle source 10 comprising a plasma processing chamber 20 that has a plasma source 30, a gas supply 40, RF antenna 55, and a plurality of ion extraction grids 50 that are each operatively connected to the processing chamber 20 according to one embodiment of the present invention. A conducting plate 60 is located at a distance 65 from a wall 35 of the plasma source 30. The distance 65 can be between 0.5 mm and 20 mm. The conducting plate 60 can be attached to the wall 35 of the plasma source 30. The conducting plate 60 has a surface 70 with a plurality of grooves 75 that face the wall 35 of the plasma source 30. A substrate support 80 is disposed within an interior portion 25 of the processing chamber 20 for supporting a substrate 100.

As shown in FIG. 3, a charged particle source 10 comprising a plasma processing chamber 20 that has a plasma source 30, a gas supply 40, RF antenna 55, and a plurality of ion extraction grids 50 that are each operatively connected to the processing chamber 20 according to one embodiment of the present invention. A conducting plate 60 is located opposite the plurality of ion extraction grids 50 at an adjustable distance 65 from a wall 35 of the plasma source 30. The distance 65 can be between 0.5 mm and 20 mm. The conducting plate 60 can be attached to the wall 35 of the plasma source 30. The conducting plate 60 has a surface 70 with a plurality of grooves 75 that face the wall 35 of the plasma source 30. A substrate support 80 is disposed within an interior portion 25 of the processing chamber 20 for supporting a substrate 100.

As shown in FIG. 4, a charged particle source 10 comprising a plasma processing chamber 20 that has a plasma source 30, a gas supply 40, RF antenna 55, and a plurality of ion extraction grids 50 that are each operatively connected to the processing chamber 20 according to one embodiment of the present invention. A conducting plate 60 with surface 70 containing a plurality of grooves 75, is located at a distance 65 from a surface 85 of another plate mounted to block line of sight of the plasma source 30 to the surface 70 of the conducting plate 60. The distance 65 can be between 0.5 mm and 20 mm. The conducting plate 60 and the plate containing the surface 85 can be attached to the wall 35 of the plasma source 30, or can be connected to the gas distribution. The conducting plate 60 has a surface 70 with a plurality of grooves 75. Surface 70 faces the surface 85 of the second plate which blocks line of sight of the plurality of grooves 75 to the plasma generation region 30. A substrate support 80 is disposed within an interior portion 25 of the processing chamber 20 for supporting a substrate 100.

In any embodiment of the present invention, the plasma source can be an inductively coupled plasma (ICP) using a planar and/or helical antenna. If a planar ICP is used with the RF coil placed behind the back of the ion source, then the anode must not be placed at the back of the source. In this case, the anode can be placed half way into the source, and the best shape for the anode is a cylindrical shape with the grooved surface being parallel to the plasma chamber walls, or to another conducting plate placed parallel to the chamber wall, with the parallel surface spacing. Alternatively the ICP can be a resonant source which includes helicons or can be energized with an RF power supply having an RF frequency between 100 kHz to 100 MHz. Alternatively, the plasma source 30 can be DC powered (e.g. DC Magnetron), a capacitively coupled plasma, a surface wave plasma source, a microwave plasma source (e.g. ECR source) or a magnetically enhanced or confined plasma source.

In any embodiment of the present invention, the ion extraction grid(s) can be a positively biased grid or a positively biased grid that is disposed between the plasma source and a negatively biased grid. The plurality of extraction grids can include at least one negatively biased grid that can be adjacent to a positively biased grid. The plurality of extraction grids can include two negatively biased grids that can be adjacent one another. The plurality of extraction grids can include at least one negatively biased grid that is disposed between a positively biased grid and a grounded grid. The plurality of extraction grids can include at least one grounded grid that can be adjacent to a negatively biased grid.

In any embodiment of the present invention, the electron source can be disposed between the ion extraction grid(s) and the substrate. The electron source can provide electrons to the substrate. The electrons that can be provided to the substrate can reduce charge accumulation on the substrate.

In any embodiment of the present invention, the substrate can be semiconductor containing such as a semiconductor substrate or contains an epitaxial layer. The semiconductor substrate can be silicon containing e.g. glass or a compound semiconductor e.g. contains a group III element. The substrate can be a ceramic wafer such as Al-containing e.g. AlTiC or C-containing. There could be devices on the substrate such as a magnetic transducer a display device or a piezo sensor transducer. The substrate can be positioned in front of the ion extraction grid(s) e.g. for use of an ion beam etch. The substrate can be positioned in front of a dielectric target, with the target being sputtered with ion beam extracted from an ion source e.g. ion beam deposition.

In any embodiment of the present invention, a process gas can be provided by the gas supply into the processing chamber. The process gas can contain an inert gas e.g. He, Ne, Ar, Xe, Kr. The process gas can contain a reactive gas e.g. a Carbon containing gas such as CxHy.

In any embodiment of the present invention, a film can be deposited within the process chamber. The film can be a dielectric material e.g. a Carbon containing film such as DLC. The film can be an insulator material. The film can be a non-conductive material. The film can be formed from a reactive gas. The film can be a byproduct of a reaction with the substrate. The film can be deposited on the substrate e.g. as a passivation layer, a masking layer, a wear resistant layer or for its desired optical properties. The film can be deposited on the ion extraction grid(s).

FIGS. 5A to 5D shows a series of blown up views of different configurations of the conducting plate 60 that can be used in any embodiment of the present invention. The conducting plate can behind the plane of an RF coil in the ion source (in case of helical RF coil designs). The conducting plate can be a part of a gas distribution manifold e.g. the manifold is a showerhead. The conducting plate can have a planar or non-planar shape. The area of the conducting plate can be greater than 25 square millimeters. The conducting plate can be parallel to the ion extraction grid(s). The conducting plate can be made of metal. The aspect ratio of a groove is the groove depth divided by the groove width. The plurality of grooves of the conducting plate can have an aspect ratio of one to one. The plurality of grooves of the conducting plate can have an aspect ratio between 1:5 (one to five) and 2:1 (two to one). The plurality of grooves of the conducting plate can have an aspect ratio of greater than two to one. The plurality of grooves of the conducting plate can have an aspect ratio of greater than five to one. The plurality of grooves can have a constant aspect ratio. The plurality of grooves can have a variable aspect ratio. The plurality of grooves can have a constant pitch. The plurality of grooves can have a variable pitch. The plurality of grooves can be in a perpendicular orientation or a slanted orientation with respect to the surface of the conducting plate. The grooves can be of a width similar to the distance of the conducting plate from the wall of the plasma source. The width of the grooves can be less than a plasma sheath thickness. The conducting plate can further comprise a second surface that has a second plurality of grooves that have a separation between 0.5 mm and 20 mm. The conducting plate can be attached to a second surface which can be a wall of the plasma source e.g. plasma source wall opposite ion extraction grid(s) or a lid of the plasma source adjacent to the extraction grid(s). The conducting plate can be electrically isolated from the second surface e.g. the conducting plate is connected to DC power supply such as the conducting plate is connected to same power supply as the ion extraction grid(s) or a positively biased grid. The second surface can be grounded. The second surface can be at the same potential as the conducting plate. The second surface can be at a lower potential than the conducting plate. The second surface can contain grooves. The second surface can be at a constant second distance from the conducting plate in a range of 1 mm to 10 mm. The second surface can be at a variable second distance from the conducting plate in a range of 1 mm to 10 mm. The second distance can be a function of the perimeter of the conducting plate. The distance and/or the second distance can be adjusted during a process or between a process run based on process feedback e.g. feedback can be positive grid current or conducting plate current.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A charged particle source comprising:
   a plasma processing chamber;
   a plasma source having a wall operatively connected to the processing chamber;
   an ion extraction grid operatively connected to the processing chamber;
   a first conducting plate within the plasma source and adjacent to the wall of the plasma source, the first conducting plate having a surface having a plurality of grooves, the plurality of grooves facing the wall of the plasma source;
   a second conducting plate within the plasma source, the second conducting plate being positioned to block the line of sight of the plurality of grooves of the first conducting plate to a plasma generation region;
   a substrate on a substrate support disposed in an interior portion of the processing chamber; and
   a gas supply operatively connected to the processing chamber.

2. The charged particle source according to claim 1 wherein the plurality of grooves having an aspect ratio of greater than two to one.

3. The charged particle source according to claim 1 wherein the plurality of grooves having a constant pitch.

4. The charged particle source according to claim 1 wherein the plurality of grooves having a constant aspect ratio.

5. The charged particle source according to claim 1 wherein the plurality of grooves having a variable pitch.

6. The charged particle source according to claim 1 wherein the plurality of grooves having a variable aspect ratio.

7. The charged particle source according to claim 1 wherein the plurality of grooves are in a perpendicular orientation with respect to the surface of the first conducting plate.

8. The charged particle source according to claim 1 wherein the first conducting plate further comprising a second surface, said second surface having a second plurality of grooves.

9. The charged particle source according to claim 1 wherein the first conducting plate is attached to the positive side of the plasma source.

10. A charged particle source comprising:
    a plasma processing chamber;
    a plasma source having a wall operatively connected to the processing chamber;
    an ion extraction grid operatively connected to the processing chamber;
    a conducting plate within the plasma source at a distance from the wall of the plasma source, the conducting plate having a plurality of grooves, the conducting plate being positioned to block the line of sight of all of the plurality of grooves of the conducting plate from a plasma generation region;
    a substrate on a substrate support disposed in an interior portion of the processing chamber; and
    a gas supply operatively connected to the processing chamber.

11. The charged particle source according to claim 10 wherein the plurality of grooves having an aspect ratio of greater than two to one.

12. The charged particle source according to claim 10 wherein the plurality of grooves having a constant pitch.

13. The charged particle source according to claim 10 wherein the plurality of grooves having a constant aspect ratio.

14. The charged particle source according to claim 10 wherein the plurality of grooves having a variable pitch.

15. The charged particle source according to claim 10 wherein the plurality of grooves having a variable aspect ratio.

16. The charged particle source according to claim 1 wherein the plurality of grooves are in a slanted orientation with respect to the surface of the first conducting plate.

17. The charged particle source according to claim 10 wherein the conducting plate further comprising a second surface, said second surface having a second plurality of grooves, the second surface having a separation between 0.5 mm and 20 mm.

18. The charged particle source according to claim 10 wherein the conducting plate is attached to the wall of the plasma source.

19. The charged particle source according to claim 10 wherein said distance is between 0.5 mm and 20 mm.

20. The charged particle source according to claim 10 wherein said distance is adjustable.

21. A charged particle source comprising:
    a plasma processing chamber;
    a plasma source having a wall operatively connected to the processing chamber;
    a plurality of ion extraction grids operatively connected to the processing chamber;
    a conducting plate within the plasma source at an adjustable distance from the wall of the plasma source, the conducting plate having a plurality of grooves, the conducting plate being positioned to block the line of sight of all of the plurality of grooves of the conducting plate from a plasma generation region, the conducting plate being opposite the plurality of ion extraction grids;
    a substrate on a substrate support disposed in an interior portion of the processing chamber; and
    a gas supply operatively connected to the processing chamber.

* * * * *